United States Patent [19]

Jarrett et al.

[11] 4,326,135
[45] Apr. 20, 1982

[54] DIFFERENTIAL TO SINGLE-ENDED CONVERTER UTILIZING INVERTED TRANSISTORS

[75] Inventors: Robert B. Jarrett; Wilson D. Pace, both of Tempe, Ariz.

[73] Assignee: Motorola, Inc., Schaumburg, Ill.

[21] Appl. No.: 125,409

[22] Filed: Feb. 28, 1980

Related U.S. Application Data

[63] Continuation of Ser. No. 877,625, Feb. 14, 1978, abandoned.

[51] Int. Cl.³ .................... H01L 27/04; H03K 19/091
[52] U.S. Cl. ...................................... 307/355; 307/477; 330/257; 357/92
[58] Field of Search ............... 307/362, 355, 459, 477; 357/92, 44, 46, 86; 330/257

[56] References Cited

U.S. PATENT DOCUMENTS

| | | | |
|---|---|---|---|
| 3,735,151 | 5/1973 | Frederiksen et al. | 307/299 B |
| 3,872,323 | 3/1975 | Frederiksen et al. | 357/92 |
| 4,007,385 | 2/1977 | Chapron | 357/92 |
| 4,064,463 | 12/1977 | Leidich | 330/257 |
| 4,081,822 | 3/1978 | Dao et al. | 357/44 |
| 4,109,162 | 8/1978 | Heuser et al. | 357/92 |
| 4,286,177 | 8/1981 | Hart et al. | 307/477 |

*Primary Examiner*—William D. Larkins
*Attorney, Agent, or Firm*—Michael D. Bingham

[57] ABSTRACT

A differential to single-ended converter circuit is disclosed which utilizes integrated injection logic device geometries to significantly reduce the area required to fabricate the converter within an integrated circuit. Inverted transistor operation and multiple collector output terminals allow the converter circuit to directly drive integrated injection logic circuitry which may be fabricated within the same integrated circuit chip. When used in conjunction with a voltage comparator circuit, the differential to single-ended converter circuit maintains the offset associated with the comparator circuit at a minimum despite variations in operating temperature and variations in integrated circuit processing.

1 Claim, 5 Drawing Figures

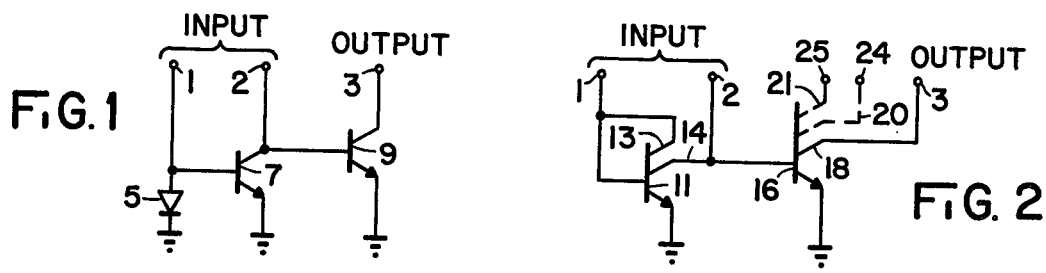
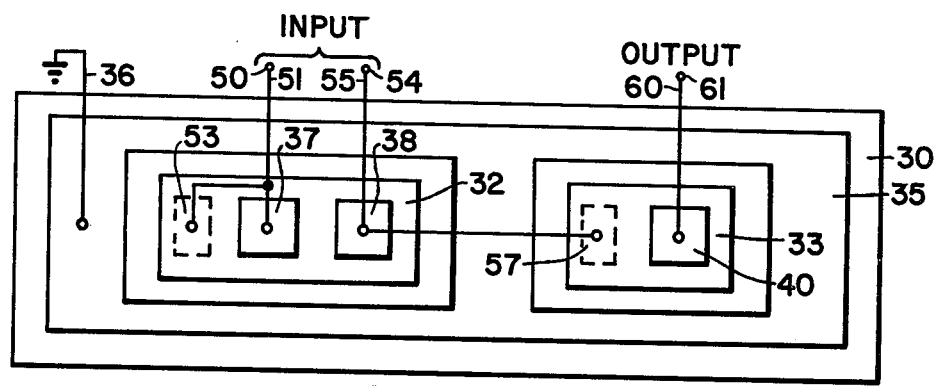
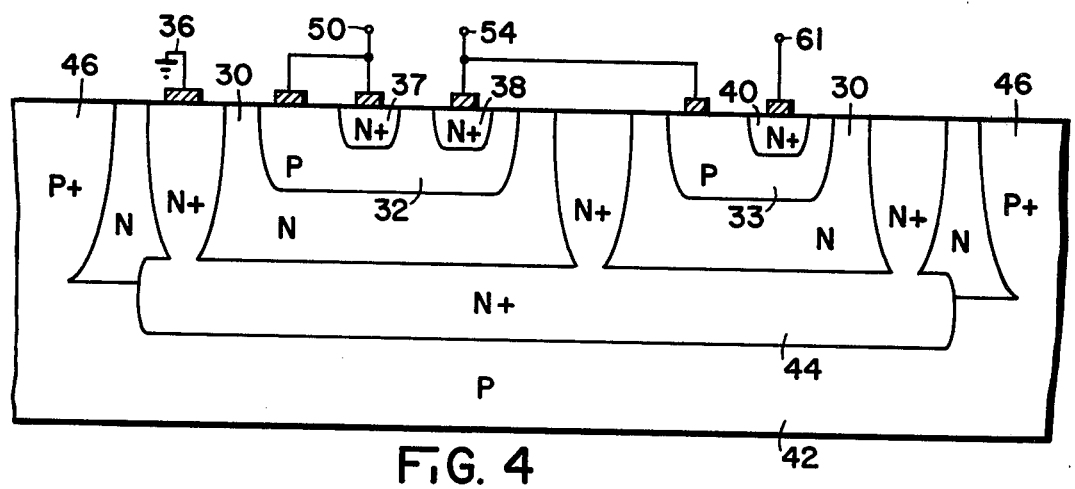
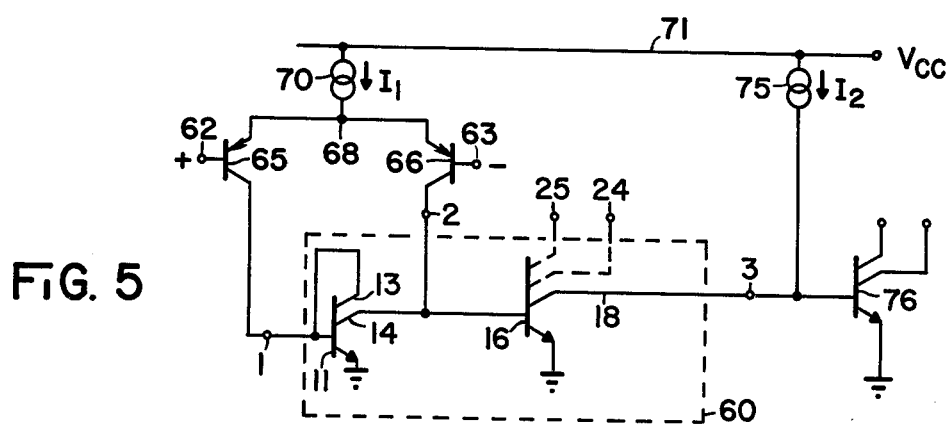

4,326,135

DIFFERENTIAL TO SINGLE-ENDED CONVERTER UTILIZING INVERTED TRANSISTORS

This is a continuation of application Ser. No. 877,625, filed Feb. 14, 1978, now abandoned.

BACKGROUND OF THE INVENTION

1. Field of the Invention

This invention relates generally to differential to single-ended converter circuits and more particularly to a differential to single-ended converter circuit which utilizes integrated injection logic techniques.

2. Description of the Prior Art

Bipolar differential input comparator circuits are well known in the integrated circuit field. Generally a comparator circuit functions to indicate whether the voltage applied to a first input is above or below the voltage applied to a second input. The differential input voltage is coupled to an emitter coupled pair of transistors, the collectors of which provide differential current drive to a differential to single-ended converter circuit.

Integrated circuit technology has advanced to the extent that analog and digital functions are often fabricated as a single integrated circuit providing an entire system on a single chip. Integrated injection logic (I²L) is well known in the prior art for providing digital logic functions with increased device densities and reducing chip area. Circuits which combine bipolar analog circuitry with I²L digital circuitry are known in the art. However the linear portions of prior art circuitry are generally constructed by using conventional NPN and PNP transistors, each employing an epitaxial region which is electrically isolated by a reverse-biased junction from the epitaxial regions used to form other transistors. Generally, the electrical isolation is achieved by diffusing a heavily-doped P-type isolation diffusion into an epitaxial region, thereby forming isolated epitaxial islands. Thus, prior art circuits which have combined analog and digital functions on a single integrated circuit chip have utilized integrated injection logic primarily within the digital portions of the chip. It is therefore easily appreciated by those skilled in the art that the use of integrated injection logic structures in the analog portions of the chip will realize a significant savings in chip area.

Furthermore, at the interface between the analog and digital portions of the circuit, it is desirable that the output from the analog circuitry be compatible with the input of the digital circuitry. It will therefore be appreciated by those skilled in the art that a differential to single-ended converter circuit providing multiple collector outputs adapted for directly driving I²L gates is a significant improvement over the prior art.

An ideal comparator circuit having zero offset will cause the single-ended output to switch when the differential input voltage is zero, i.e., when the first input voltage and the second input voltage are equal. It is desirable to maintain the comparator offset at a minimum despite changes in temperature in a given chip or changes in processing from one chip to another. Because conventional NPN and PNP transistors have different characteristics from I²L devices, the parameters for conventional transistors vary in a different manner from the variation in the parameters of I²L devices when a circuit is subjected to changes in temperature or processing. Therefore, it should be appreciated by those skilled in the art that a differential to single-ended converter circuit which interfaces directly to I²L circuitry and which minimizes the offset associated with a comparator circuit despite changes in temperature or processing is a significant improvement over the prior art.

SUMMARY OF THE INVENTION

An object of the present invention is to provide a differential to single-ended converter using I²L device geometries for reducing the area required to fabricate the converter in an integrated circuit.

It is also an object of this invention to provide a differential to single-ended converter having multiple output terminals.

It is also an object of this invention to provide a differential to single-ended converter which is adapted for directly driving integrated injection logic circuitry.

Finally, it is an object of this invention to provide a differential to single-ended converter circuit which is compatible with integrated injection logic circuitry and which, when used with a voltage comparator circuit, minimizes the offset associated with the comparator circuit.

Briefly described, the present invention relates to a differential input to single-ended output converter circuit including a first transistor having first and second collectors and a second transistor having one or more collectors, the first and second transistors being inverted such that the emitter of the first transistor and the emitter of the second transistor are formed by a common semiconductor region. The first collector of the first transistor is connected to the base of the first transistor to form a diode. The first and second collectors of the first transistor receive a differential input signal. The second collector of the first transistor is connected to the base of the second transistor for switching the second transistor between conductive and nonconductive states. Each collector of the second transistor is adapted for directly driving the input of an I²L gate. The fabrication of the first and second transistors as inverted devices sharing a common emitter semiconductor region results in a significant savings in chip area. In addition the matching between the device characteristics of the first and second transistors allows the offset of an associated comparator circuit to be maintained at a minimum regardless of changes in temperature or circuit processing.

BRIEF DESCRIPTION OF THE DRAWINGS

FIG. 1 is a circuit schematic of a differential input to single-ended output converter circuit.

FIG. 2 is a circuit schematic showing the preferred embodiment of the invention including a first dual collector transistor and a second multiple collector transistor.

FIG. 3 is a top view of an integrated circuit chip showing the first and second transistors and the interconnections thereto.

FIG. 4 is a cross-section of an integrated circuit which corresponds to the top view shown in FIG. 3.

FIG. 5 is a circuit schematic of a differential to single-ended converter used in conjunction with a comparator circuit for directly driving integrated injection logic circuitry.

DESCRIPTION OF THE PREFERRED EMBODIMENT

In FIG. 1 a circuit schematic is shown for a converter circuit which receives a differential input signal at terminals 1 and 2 which generates a single-ended output signal at terminal 3. Input terminal 1 is coupled to the anode of diode 5 and to the base of transistor 7. The cathode of diode 5 and the emitter of transistor 7 are coupled to a source of ground potential. Diode 5 and transistor 7 are matched devices such that the forward voltage of diode 5 equals the forward base-emitter voltage of transistor 7 when the current conducted by diode 5 equals the emitter current of transistor 7. Input terminal 2 is coupled to the collector of transistor 7 and to the base of transistor 9. The emitter of transistor 9 is coupled to a source of ground potential. The collector of transistor 9 is coupled to output terminal 3.

The differential input signal provides a first input current to terminal 1 and a second input current to terminal 2. The first input current is caused to flow through diode 5, thereby generating a corresponding forward bias voltage at the base terminal of transistor 7. Because transistor 7 and diode 5 are matched devices, the collector of transistor 7 attempts to conduct a current equal to that flowing through diode 5. If the second input current provided to input terminal 2 is equal to the first input current provided at input terminal 1 then the collector of transistor 7 is able to conduct all of the current provided to input terminal 2. In this event, transistor 9 will be in a nonconductive state because there is no base current available with which to forward bias transistor 9. However, if the input current supplied to input terminal 2 exceeds the input current supplied to input terminal 1, then the collector of transistor 7 cannot conduct all of the available current supplied to input terminal 2. In this event, the excess current is available to flow into the base of transistor 9 thereby rendering transistor 9 conductive. If on the other hand, the input current supplied to input terminal 1 exceeds that supplied to input terminal 2 then transistor 7 will become saturated, as the collector of transistor 7 is not provided with sufficient current to satisfy the current demanded by the forward biased base-emitter junction. With transistor 7 in saturation, no excess current is available to be supplied to the base of transistor 9, rendering transistor 9 nonconductive. Thus, a control current is generated at the collector of transistor 7 representing the excess of the current supplied by input terminal 2 over the current demanded by transistor 7. This control current responds to the differential input signal for switching transistor 9 between conductive and nonconductive states.

In FIG. 2 the circuit of FIG. 1 is shown as implemented with inverted multi-collector transistors according to a preferred embodiment of the invention. A first transistor 11 is shown having a first collector 13 and a second collector 14. A second transistor 16 is shown having a first collector 18, a second collector 20, and a third collector 21. The differential input signal is again received at input terminals 1 and 2. Input terminal 1 is coupled to collector 13 and to the base of transistor 11. The emitter of transistor 11 is coupled to a source of ground potential. Thus, first collector 13 is connected such that a diode is formed within transistor 11 corresponding to diode 5 in FIG. 1. Input terminal 2 is coupled to the second collector 14 of transistor 11 and to the base of transistor 16. Second collector 14 corresponds to the collector of transistor 7 in FIG. 1, and acts as before to switch transistor 16 between conductive and nonconductive states. Collector 18 of transistor 16 is coupled to output terminal 3. Thus, when transistor 16 is nonconductive, output terminal 3 will appear to be a high impedance. Output terminals 24 and 25 are coupled to collectors 20 and 21 respectively. Thus, when transistor 16 is nonconductive output terminals 24 and 25 will also be high impedances. However, when transistor 16 is made conductive, collectors 18, 20, and 21 will conduct and output terminals 3, 24, and 25 can be used to sink a load current (not shown).

By fabricating first transistor 11 and second transistor 16 as inverted transistors compatible with integrated injection logic processing, multiple collector transistors having small geometries and relatively high inverse gains can easily be provided. In FIG. 3, a top view of an integrated circuit is shown in which a differential to single-ended converter circuit is constructed according to one embodiment of the invention. Semiconductor region 30 is an epitaxial semiconductor layer of N-type conductivity formed upon a P-type semiconductor substrate which is shown in greater detail in FIG. 4. Within semiconductor region 30 a first P-type semiconductor region 32 and a second P-type semiconductor region 33 are formed, corresponding to the base regions of a first and a second transistor, respectively. A heavily doped N-type semiconductor region 35 can be formed within semiconductor region 30 to surround P-type semiconductor regions 32 and 33. As is well known in the $I^2L$ art, semiconductor region 35 increases the current amplification factors, or inverse gains, of the transistors and also functions to isolate the first transistor from the second by eliminating the parasitic effects of the PNP transistor formed by region 32, region 30, and region 33. However, the emitter regions of the first transistor and the second transistor, formed by epitaxial region 30, are electrically coupled by semiconductor region 35. Conductor 36 makes ohmic contact to semiconductor region 35 and biases epitaxial region 30 to ground potential.

Formed within P-type semiconductor region as N-type semiconductor regions 37 and 38 corresponding to first and second collectors, respectively, of the first transistor. Formed within P-type semiconductor region 33 is N-type semiconductor region 40, corresponding to a first collector of the second transistor. It will be obvious to those skilled in the art that additional collector regions can be formed within P-type semiconductor region 33 to provide multiple output signals. For purposes of illustration, the first and second transistors shown in FIG. 3 have been placed end to end to correspond to the cross-sectional view shown in FIG. 4. However, it will be obvious to those skilled in the art that semiconductor regions 32 and 33 can be formed side by side to yield a more compact structure.

The structure described in FIG. 3 is shown in cross-sectional detail in FIG. 4. The circuit is fabricated within a P-type substrate 42 in which a heavily doped N-type buried layer 44 has been formed. Epitaxial region 30 has been isolated from other epitaxial regions by a heavily doped P-type diffusion shown generally as 46.

Referring again to FIG. 3, a first input terminal 50 is coupled to a conductor 51 which makes ohmic contact to first collector region 37 and to base region 32 at base contact 53. A second input terminal 54 is coupled to conductor 55 which makes ohmic contact to the second collector region 38 and to the base region 33 of the second transistor at contact 57. Collector region 40 of the second transistor make an ohmic contact with conductor 60 which is connected to output terminal 61. Thus, terminals 50 and 54 provide a means for receiving the differential input signal and output terminal 61 is a means for providing a single-ended output signal. Conductor 51 is a means for connecting the base region of the first transistor to the first collector region of the first transistor and to input terminal 50. Conductor 55 is a means for coupling the second collector region of the first transistor to the base region of the second transistor and to a second input terminal.

As is apparent in FIG. 4 the first and second transistors are vertical NPN structures which are operated in an inverted mode such that the epitaxial region 30 functions as the emitter for both the first and the second transistors. By forming diode 5, transistor 7, and transistor 9 (shown in FIG. 1) in a single isolated epitaxial region, a differential to single-ended converter circuit is provided which requires much less area than prior art converter circuits. In addition, multiple outputs signals are easily provided without significantly increasing the size of the circuit.

In FIG. 5 the differential to single-ended converter circuit of FIG. 2 is shown in block 60 in conjunction with a comparator circuit and integrated injection logic circuitry. A differential input voltage is received on input terminals 62 and 63, which are coupled to the base of emitter-coupled transistors 65 and 66, respectively. The emitter terminals of transistors 65 and 66 are coupled at node 68 to one terminal of current source 70 which supplies a current I $I_1$ to the emitter-coupled transistors. The second terminal of current source 70 is coupled to conductor 71 which is biased with a positive voltage, $V_{CC}$. As the differential input voltage is varied, the currents provided by the collectors of transistor 65 and 66 will vary accordingly. If the voltages applied to terminal 62 and 63 are equal then transistors 65 and 66 will each conduct half of the current supplied by current source 70, or $I_1/2$.

The collectors of transistors 65 and 66 are coupled to input terminals 1 and 2, respectively, of the differential to single-ended converter circuit 60. As has already been discussed with reference to FIG. 1 a control current is generated at collector 14 of transistor 11 which is responsive to the differential input signal received at terminals 1 and 2. In response to variations in the control current, transistor 16 is switched between conductive and nonconductive states. Collector 18 of transistor 16 is connected to the input of an I²L gate via terminal 3. A current source, 75, is coupled between positive voltage supply conductor 71 and the base of integrated injection logic transistor 76. When transistor 16 is nonconductive, the current supplied by current source 75 flows into the base of transistor 76 and allows transistor 76 to be conductive. If transistor 16 is conductive, however, the current supplied by current source 75 flows into collector 18 and is diverted from the base of transistor 76, forcing transistor 76 to be nonconductive. Integrated injection logic circuitry is well known in the art and will not be further explained. For a more detailed explanation of integrated injection logic, see Hart, Slob, and Wulms, "Bipolar LSI Takes A New Direction With Integrated Injection Logic", *Electronics*, Oct. 3, 1974.

In order that the comparator circuit have zero offset it is desirable that transistor 16 switch from its conductive to its nonconductive state when the collector current supplied by transistor 65 is equal to the collector current supplied by transistor 65. In order for collector 18 of transistor 16 to conduct all of the current $I_2$ supplied by current source 75, transistor 16 must be supplied with sufficient base current drive such that the base current $i_b$ multiplied by the inverse current gain $\beta_I$ of transistor 16 equals current $I_2$. When the control current, representing the excess of current supplied by input terminal 2 over the current drawn by collector 14 of transistor 11, equals $I_2/\beta_I$, transistor 16 will switch the output. If output terminals 24 and 25 are also connected to I²L gates, then the control current must be three times $I_2/\beta_I$.

In order for the comparator circuit to have zero offset, transistor 16 should be when the voltages applied to terminals 62 and 63 are equal, i.e., when the currents provided by the collectors of transistors 65 and 66 are each $I_1/2$. If the current in collector 13 is designated $I_C$, then the current in collector 14 is also $I_C$. Therefore, the base current supplied to transistor 11 is $2I_C/\beta_I$. The current gain, $\beta_I$, of transistor 11 is the same as that for transistor 16 because transistors 11 and 16 are both fabricated as inverted transistors as shown in FIG. 3. Therefore, the current $I_1/2$ supplied by the collector of transistor 65 is equal to the current in collector 16, $I_C$, plus the base current supplied to transistor 11, $2I_C/\beta_I$. The current $I_1/2$ supplied by the collector of transistor 66 is equal to the current in collector 14, $I_C$, plus the base current supplied to transistor 16. Therefore, for zero offset at the transition point at which transistor 16 switches, it can be shown that the base current to transistor 16 must equal the base current supplied to transistor 11, i.e., $2I_C/\beta_I$. For the case where transistor 16 has a single collector, this is accomplished by making current source 75 provide a current $I_2$ equal to $2I_C$. Since $I_C$ is approximately $I_1/2$, making $I_2$ equal to $I_1$ will satisfy the zero offset condition. The approximation that $I_C$ equals $I_1/2$ is reasonable when the circuit is fabricated with an I²L compatible process which yields relatively high inverse current gains. For the case where transistor 16 has a plurality of collectors, n, each of which must sink an I²L gate current $I_2$, $I_1$ is made equal to n times $I_2$.

Techniques are well known in the art for constructing ratioed current sources to supply currents $I_1$ and $I_2$ such that the ratio of the currents is constant over changes in temperature of circuit processing. Because the current gain characteristics of transistor 11 and transistor 16 are matched, the base current supplied to the base of transistor 11 by the collector of transistor 65 at the transition point will always be substantially equal to the base current supplied to the base of transistor 16 by the collector of transistor 66, even though temperature or circuit processing varies. Thus, by fabricating both transistor 11 and transistor 16 as inverted devices, the offset error of the comparator can be minimized while providing a differential to single-ended converter circuit which saves chip area and provides multiple outputs for directly driving I²L gates.

While the invention has been described with reference to a preferred embodiment, the description is for illustrative purposes and is not to be construed as limiting the scope of the invention. Various modifications and changes may occur to those skilled in the art without departing from the true spirit and scope of the invention as defined by the appended claims.

We claim:

1. A differential input to single-ended output converter fabricated as an integrated circuit comprising:

(a) first and second transistors each having emitter, base and collector electrodes, the emitter electrodes of the first and second transistors being coupled to each other, the base electrodes of the first and second transistors being coupled to first and second input terminals, respectively, for receiving a differential input signal;

(b) a first current source connected between a power supply conductor and the emitter electrodes of the first and second transistors for supplying a current of a first magnitude;

(c) a first inverted transistor having emitter, base, and first and second collector electrodes, the emitter electrode being coupled to a reference conductor, the base and first collector electrodes being coupled to the collector electrode of the first transistor, and the second collector electrode being coupled to the collector electrode of the second transistor;

(d) a second inverted transistor having emitter and base electrodes, and having N collector electrodes where N is an integer greater than 1, the emitter electrode being coupled to the reference conductor, and the base electrode being coupled to the second collector electrode of the first inverted transistor;

(e) a source of injection current being connected between each of said N collector electrodes of the second inverted transistor and the power supply conductor and having a second magnitude which is 1/N times said first magnitude such that offset error associated with the differential input to single-ended output converter is substantially zero; and (f) integrated injection logic means for performing a switching function including an inverted switching transistor, the inverted switching transistor having emitter and base electrodes and having a plurality of collector electrodes, the emitter electrode being coupled to the reference conductor and the base electrode being coupled to at least one of said N collector electrodes of the second inverted transistor.

* * * * *